(12) United States Patent
Mitchell et al.

(10) Patent No.: US 7,023,365 B1
(45) Date of Patent: Apr. 4, 2006

(54) SYSTEM AND METHOD FOR COMPRESSION OF WORDS AND PHRASES IN TEXT BASED ON LANGUAGE FEATURES

(75) Inventors: James P. Mitchell, Cedar Rapids, IA (US); Kristen M. Reichenauer, Monticello, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 41 days.

(21) Appl. No.: 10/824,923

(22) Filed: Apr. 15, 2004

(51) Int. Cl.
*H03M 7/40* (2006.01)
(52) U.S. Cl. .......................................... 341/67; 341/65
(58) Field of Classification Search .................... 704/8; 341/67, 107; 375/240
See application file for complete search history.

(56) References Cited

U.S. PATENT DOCUMENTS

| | | | | |
|---|---|---|---|---|
| 5,027,376 | A | * | 6/1991 | Friedman et al. ........... 375/240 |
| 5,787,386 | A | * | 7/1998 | Kaplan et al. ................. 704/8 |
| 6,512,793 | B1 | * | 1/2003 | Maeda ................... 375/240.08 |
| 6,795,503 | B1 | * | 9/2004 | Nakao et al. .......... 375/240.16 |
| 2002/0006162 | A1 | * | 1/2002 | Nakao et al. .......... 375/240.16 |
| 2005/0146451 | A1 | * | 7/2005 | Kobayashi et al. ......... 341/107 |

OTHER PUBLICATIONS

"ARINC Introduces a Digital ATIS Package for Smaller Airports", ARINC, Inc., Annapolis, Maryland [online], [retrieved on May 7, 2004]. Retrieved from the Internet: <URL: http://www.arinc.com/news/2003/07-15-03.html>.

J. Jiang and S. Jones, "Word-Based Dynamic Algorithms for Data Compression." IEE Proceedings-I, vol. 139, No. 6, Dec. 1992, pp. 582-586.

U.S. Appl. No. 09/660,013, "System and Method for Real Time Textual Data Compression and Textual Data Manipulation Using Unique Numerical Identification of Entire Words," filed Sep. 12, 2000, James P. Mitchell.

* cited by examiner

*Primary Examiner*—Peguy JeanPierre
*Assistant Examiner*—Joseph Lauture
(74) *Attorney, Agent, or Firm*—Nathan O. Jensen; Kyle Eppele

(57) ABSTRACT

A system for compressing text using variable length codes includes a memory device and an encoder. The memory device is configured to store a set of variable length codes for a plurality of languages for compression of a text, where the set of variable length codes includes variable code lengths based on language features. The encoder is coupled to the memory device and is configured to receive text in at least one of the plurality of languages, to generate a compressed text by assigning a code to each word in the text based on codes from the set of variable length codes that are associated with the at least one language to the text and to generate at least one header to be inserted in the compressed text. The header includes information regarding the location in the compressed text of a subsequent change in code length.

26 Claims, 7 Drawing Sheets

| Word/Phrase | Original Length | Assigned Variable Code Length | Code Example | Compression |
|---|---|---|---|---|
| the_ | 4 bytes including trailing space | 2 bytes | (header) (payload) xxxx xxxx xxxx | 2X |
| original_ | 9 bytes including trailing space | 3 bytes | (header) (payload) (payload) xxxx xxxx xxxx xxxx xxxx | 3X |
| the_need_to_ | 12 bytes including trailing space | 4 bytes | (header) (payload) (payload) (payload) xxxx xxxx xxxx xxxx xxxx xxxx xxxx | 4X |

FIG. 4

Code Breakdown

| Bit | Description |
|---|---|
| 15 | MSb (header) distance to next change in code length |
| 14 | |
| 13 | |
| 12 | |
| 11 | |
| 10 | LSb (header) distance to next change in code length |
| 9 | MSb (header) for length of associated code or payload |
| 8 | LSb for length of associated code or payload |
| 7 | MSb of Code Word (payload) |
| 6 | |
| 5 | |
| 4 | |
| 3 | |
| 2 | |
| 1 | |
| 0 | |

FIG. 5

SYSTEM AND METHOD FOR COMPRESSION OF WORDS AND PHRASES IN TEXT BASED ON LANGUAGE FEATURES

FIELD OF THE INVENTION

The invention relates generally to data communication and in particular to encoding and compression of text, including words and phrases, for data transmission.

BACKGROUND

Many data transmission applications (e.g., communication between an aircraft and systems or devices on the ground, cellular communications (e.g., via cellular telephones), wireless communications or communications between computers or computer networks) utilize data compression techniques to reduce the size of the data to save space or transmission time. Data compression may be required for a lower bandwidth network, such as a wireless network or wireless vehicle network including an aircraft and ground. In addition, data compression may be used to optimize the bulk transfer of large documents, HTML, e-mail or any large amounts of data.

There are numerous known techniques for data compression such as LZ7, WinZip, PKZip and so on. Most of these compression processes require fixed length files as inputs in order to begin the compression process and to quantify character sequence redundancies needed to provide loss-less file reduction. These compression methods do not work efficiently with real-time streaming text broadcasts that are required by many wireless applications (e.g., aircraft to ground, Internet applications, mobile ground-vehicle uses, etc.). For example, many known compression processes require a finite block or page of information as an input to determine the "local" redundancies. The "local" redundancies are used to establish an alias transmission code set and the code set is typically discarded with each file processed. This type of compression requires batch processing of files at a network proxy server and results in a complex and costly system. Furthermore, compression processes that require a file to be fully read-in first introduce latencies that may have undesirable effects on some network client applications. In addition, the high variance in textual language features can limit the performance of existing compression routines (e.g., to two times compression).

Several data compression techniques use fixed length codes to represent characters of text. Fixed length codes however, may not provide the most efficient representation of characters in text. Alternatively, several data compression techniques have been developed that use variable length codes to represent characters in a text, such as Huffman encoding (or Huffman compression). Huffman encoding is an algorithm for compression of files based on the frequency of occurrence of a symbol or character in the text that is being compressed. Huffman encoding assigns smaller codes for more frequently used characters and larger codes for less frequently used characters. The result is a smaller number of bits in the compressed text.

Characters of words and phrases of text in a computer may be represented in a script or text code such as ASCII (American Standard Code for Information Interchange) or UNICODE (Unicode Worldwide Character Standard) to transfer data from one computer to another. ASCII is a format for text files in computers and on the Internet where each character is represented with a fixed length 7-bit binary number. UNICODE is a system for representing and processing (e.g., setting fixed length binary codes for text or script characters) texts in a plurality of languages. It may be desirable to identify and compress words and phrases in text rather than encoding individual characters in text. It may also be desirable to provide a compression technique that may be used to compress words and phrases of text in multiple languages. The compression of words and phrases in text, however, may result in millions of codes when representing one or more languages. A fixed code length for representing text words for multiple languages could be at least twenty (20) bits in length which may be an inefficient code length for representing shorter text words. While the use of a variable length code may reduce the number of bits needed to compress words and phrases from multiple languages, a problem is presented with how a device receiving the compressed text with variable code lengths identifies or discerns where one code (or length of bits representing a word or phrase in the text) ends and another code begins (i.e., how to identify the changes in code length in the compressed text).

Accordingly, there is a need for system and method for compressing words and phrases in text for multiple languages. There is also a need for a system and method for compressing real-time broadcast text streams that does not require a fixed length input file. In addition, there is also a need for a system and method for identifying and tagging code length changes in variable length codes. It would be advantageous to provide a system and method for compressing text that utilizes a "global" variable length code set for a plurality of languages.

SUMMARY

In accordance with one embodiment, a system for compressing text using variable length codes includes a memory device configured to store a set of variable length codes for a plurality of languages for compression of text, wherein the set of variable length codes includes variable code lengths based on language features and an encoder coupled to the memory device, the encoder configured to receive text in at least one of the plurality of languages, to generate a compressed text by assigning a code to each word in the text based on codes from the set of variable length codes that are associated with the at least one language of the text and to generate at least one header to be inserted in the compressed text, the header including information regarding the location in the compressed text of a subsequent change in code length.

In accordance with another embodiment, a system for compressing and decompressing text using variable length codes includes a first memory device configured to store a set of variable length codes for a plurality of languages for compression of text, wherein the set of variable length codes includes variable code lengths based on language features and an encoder coupled to the first memory device, the encoder configured to receive text in at least one of the plurality of languages, to generate a compressed text by assigning a code to each word in the text based on codes from the set of variable length codes that are associated with the at least one language of the text and to generate at least one header to be inserted in the compressed text, the header including information regarding the location in the compressed text of a subsequent change in code length. The system also includes a second memory device configured to store the set of variable length codes for a plurality of languages for decompression of the text and a decoder in data communication with the encoder and coupled to the second memory device, the decoder configured to receive the compressed text, to generate a decompressed text by identifying a word associated with each code in the compressed text based on the set of variable length codes stored in the second memory device. The decoder identifies changes in code length based on the at least one header included in the compressed text.

In accordance with yet another embodiment, a system for decoding compressed text using variable length codes includes a memory device configured to store a set of variable length codes for a plurality of languages for decompression of text, wherein the set of variable length codes includes variable code lengths based on language features and a decoder coupled to the memory device, the decoder configured to receive the compressed text having a plurality of codes and at least one header, to generate a decompressed text by identifying a word associated with each code in the compressed text based on the set of variable length codes stored in the second memory device. The at least one header includes information regarding the location in the compressed text of a subsequent change in code length. The decoder identifies changes in code length based on the at least one header included in the compressed text.

In accordance with another embodiment, a method for compressing text using variable length codes includes receiving text to be compressed, identifying a language of the text, generating a compressed text by assigning a code to each word of the text using a set of variable length codes associated with the language of the text, identifying each change in code length in the compressed text, and inserting at least one header in the compressed text, the at least one header including information regarding the location in the compressed text of a subsequent change in code length.

Alternative examples and other exemplary embodiments relate to other features and combinations of features as may be generally recited in the claims.

BRIEF DESCRIPTION OF THE DRAWINGS

The invention will become more fully understood from the following detailed description, taken in conjunction with the accompanying drawings, wherein like reference numerals refer to like elements, in which:

FIG. 4 is a table showing exemplary variable length code and header formats in accordance with an embodiment.

FIG. 5 is a table showing the content of an exemplary variable length code including a header in accordance with an embodiment.

DETAILED DESCRIPTION OF PREFERRED AND EXEMPLARY EMBODIMENTS

Figure 1:
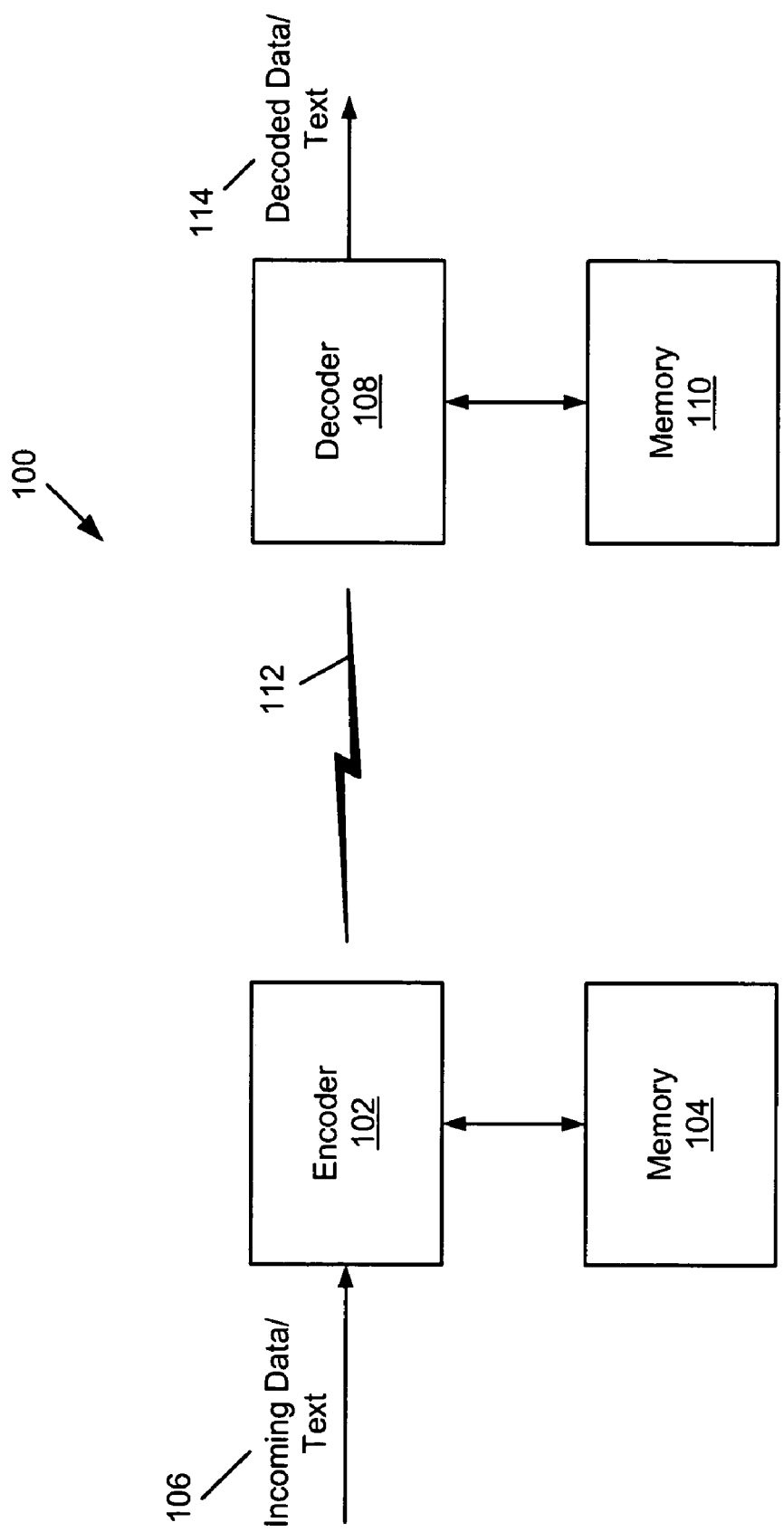
FIG. 1 is a schematic block diagram of a system for text compression and decompression using variable length codes for a plurality of languages in accordance with an embodiment.

FIG. 1 is a schematic block diagram of a system 100 for text compression and decompression using variable length codes for a plurality of languages in accordance with an embodiment. System 100 includes an encoder 102, memory 104, a decoder 108 and memory 110. System 100 may be used in a communication system to compress and decompress data or text transmitted between systems or devices in the communication system. For example, encoder 102 and memory 104 may be incorporated in or coupled to a transmission device (not shown) that is configured to transmit data wirelessly via, for example, an antenna and decoder 108 and memory 110 may be incorporated in or coupled to a receiver device (not shown) that is configured to receive data wirelessly via, for example, an antenna. Alternatively, data may be transmitted between a transmission device and receiver device via a wired connection. System 100 may be used in communication system for numerous applications such as to compress and decompress text (e.g., e-mail, Internet web pages, electronic documents, etc.) in a communication system for cell phones, computer networks, ground to air and air to ground data transmission to/from an aircraft, etc. In one embodiment, system 100 may be used to compress text sent to and from an aircraft (e.g., to a passenger or crew member) to make more efficient use of bandwidth and to minimize the amount of digital traffic to the aircraft. The transfer of text may occur as part of data services provided to the aircraft, such as services in which users may access the Internet, e-mail, a corporate intranet, etc. An international flight aircraft, for example, may include hundreds of clients that access the Internet and email through a single satellite link.

In an exemplary embodiment, a computer system is used which has at least one processing unit that executes sequences of instructions contained in memory. More specifically, execution of the sequences of instructions causes the processing unit to perform steps, which are described below. The instructions may be loaded onto a random access memory (RAM) for execution by a processing unit from a read-only memory (ROM), a mass storage device, or some other persistent storage. In other embodiments, hardwired circuitry may be used in place of, or in combination with, software instructions to implement exemplary embodiments. Thus, the embodiments described herein are not limited to any specific combination of hardware circuitry and software, nor to any particular source for instructions executed by the computer system.

Encoder 102 is configured to receive text 106 and to compress text 106 before transmission to another device. Text 106 may be originally represented in a code such as ASCII, UNICODE, etc. Encoder 102 may include various types of circuitry, digital and/or analog, and may include a microprocessor, microcontroller, application-specific integrated circuit (ASIC), programmable logic, and/or other circuitry configured to perform various input/output, control, analysis, and other functions described herein. As mentioned above, encoder 102 may be implemented as software instructions or as a combination of hardware and software instructions to perform various functions. Preferably, encoder 102 is configured to compress entire words and phrases in text 106 using variable length codes (i.e., codes with varying numbers of bits). Identification and compression of text words and phrases (or word sequences) rather than just characters in the text, enable the assignment of shorter variable length codes for compression. Memory 104 is coupled to encoder 102 and is configured to store variable length codes (or a code set) for compression of text. The variable length code set is preferably generated for all words of plurality of languages, for example, for all documented languages found world-wide that may be represented by ASCII, UNICODE or a similar character representation standard that is intended to transfer text message and computer mark-up languages over networks. In addition, the set of variable length codes is based on language features such as word length, frequency of occurrence of a word, and so on. Generation of the variable length codes is described in more detail below with respect to FIG. 2.

Text 106 is compressed by encoder 102 and transmitted via a communication link 112 to decoder 108. Communication link 112 may be a wireless communication link (e.g., radio frequency (RF), cellular, satellite, etc.) or a wired communication link. Decoder 108 is configured to receive compressed text and to decompress the text and provide the decoded text 114 to another system or device coupled to the decoder 108. Decoder 108 may include various types of circuitry, digital and/or analog, and may include a microprocessor, microcontroller, application-specific integrate circuit (ASIC), programmable logic, and/or other circuitry configured to perform various input/output, control, analysis, and other functions therein. As mentioned above, decoder 108 may be implemented as software instructions or as a combination of hardware and software instructions to perform various functions. Decoder 108 is configured to decompress the text using the set of variable length codes which may be stored in memory 110 coupled to decoder 108.

Figure 2:
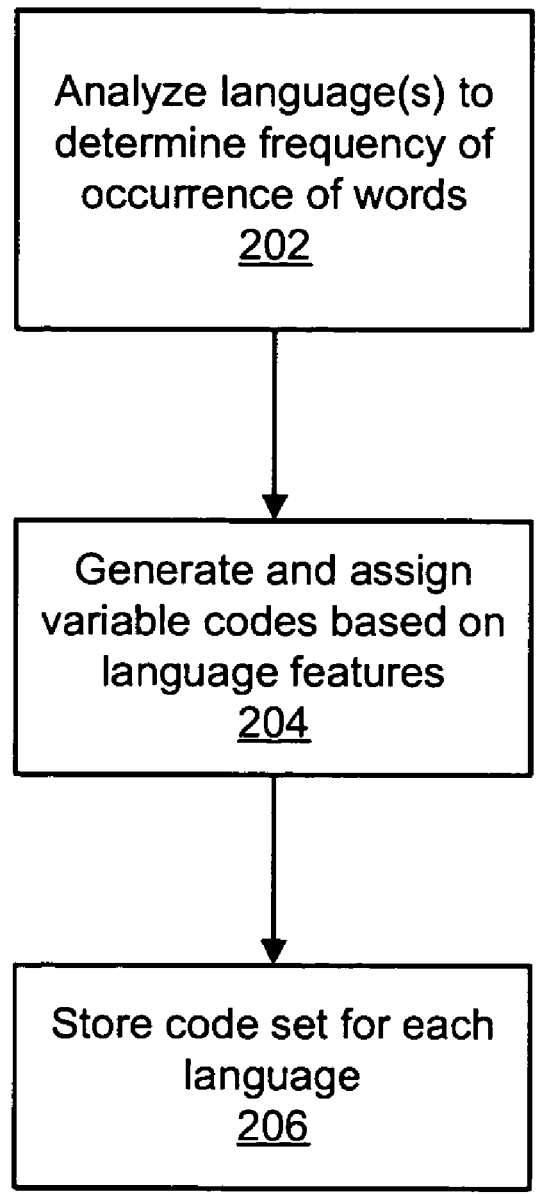
FIG. 2 illustrates a method for generating a set of variable length codes for compression of text for a plurality of languages in accordance with an embodiment.

As mentioned, memory 104 and memory 110 may be used to store variable length codes (or code set) used to compress and decompress text, i.e., words and/or phrases in text, for a plurality of languages, for example, all documented languages found world-wide that may be represented by ASCII, UNICODE or other similar character representation standards intended to transfer text messages and computer mark-up languages. FIG. 2 illustrates a method for generating a variable length code for a plurality of languages in accordance with an exemplary embodiment. Preferably, the variable length code (or code set) used for text compression is based on language features such as the particular language, length of a word, length of a word plus a space or punctuation mark, frequency of occurrence of a word, etc. and is generated for a plurality of languages or alternatively for all words in all languages world-wide. A variable length code (or length of bits) is generated and assigned for at least each word in a language as well as for certain phrases and frequent character sequences (e.g., HTML strings) in a language. Human languages do not use all possible text character combinations provided by an alphabet (e.g., in English "gfhumx" is not a word). Accordingly, the variable length code set generated does not require a compression code for all random character sequences. Therefore, the size of the code set is reduced as well as the maximum code length needed to represent valid text words, phrases and frequent character sequences.

At block 202, each language is analyzed statistically to determine the frequency of occurrence of words in a language. In a preferred embodiment, the universe of all words for each language are analyzed to determine the probability of occurrence for each word in a language. Each language may be analyzed using known statistical algorithms. Accordingly, a permanent variable length code (or length of bits) may be generated for each text word in each language and serves as a standard for compressing and decompressing text. In other words, a "global" variable length code set may be generated and used for all texts, including continuous, broadcast text streams. In an alternative embodiment, a page of text or a particular document may be analyzed to determine the frequency of occurrence for words in the particular page or document. In another embodiment, millions of pages of text in different areas (Internet, books, etc.) may be analyzed to determine the frequency of occurrence of words in a particular language.

Once the frequency of occurrence for the words of a language is determined, a compression algorithm is applied to generate and assign variable length codes based on language features at block 204. Preferably, the compression algorithm is Huffman encoding (or Huffman compression) which is known in the art. Huffman encoding is applied to assign the optimal code to each word of the language based on the frequency of occurrence of the word and the length of the word. As mentioned, variable length codes may be generated for a plurality of languages. Preferably, a variable length code is assigned to each word in a language. For example, short, frequently occurring words (such as "a," "the," and "and" in English) may be assigned a two byte code and longer, less frequently used words may be assigned a three byte code and so on. In addition, variable length codes may be generated and assigned to certain phrases and frequent character sequences in a language. At block 206, the assigned variable length codes for the words of a language are stored, for example, in memory 104 and memory 110 shown in FIG. 1, so that the code set may be available for compression and decompression of text.

If a text word is added to a language (or languages) after the variable length codes are generated and assigned, the word may, for example, be assigned to the next code at the end and not take into consideration the frequency of occurrence. In this approach, however, the new word may not be assigned the most efficient code. Alternatively, the word may be added to the universe of words for the language (or languages) and the steps of block 202 and block 204 performed on the language (or languages) again to generate and assign new variable length codes. In another embodiment, an encoder may identify the new text word as not having an assigned variable length code and may send the new word through as clean text. The receiving device will identify and tag the new word as clean text and the receiving device will take the incoming word literally and not look up a code. In addition, if a random sequence or string of characters (i.e., not a valid text word) is presented to the encoder, the random sequence of text characters (e.g., in English "gfhumx") is recognized as not being a word and is passed through as uncompressed. The decoder at the other end is configured to recognize the random sequence of text characters as not being a word and to pass the text through unchanged.

Figure 3:
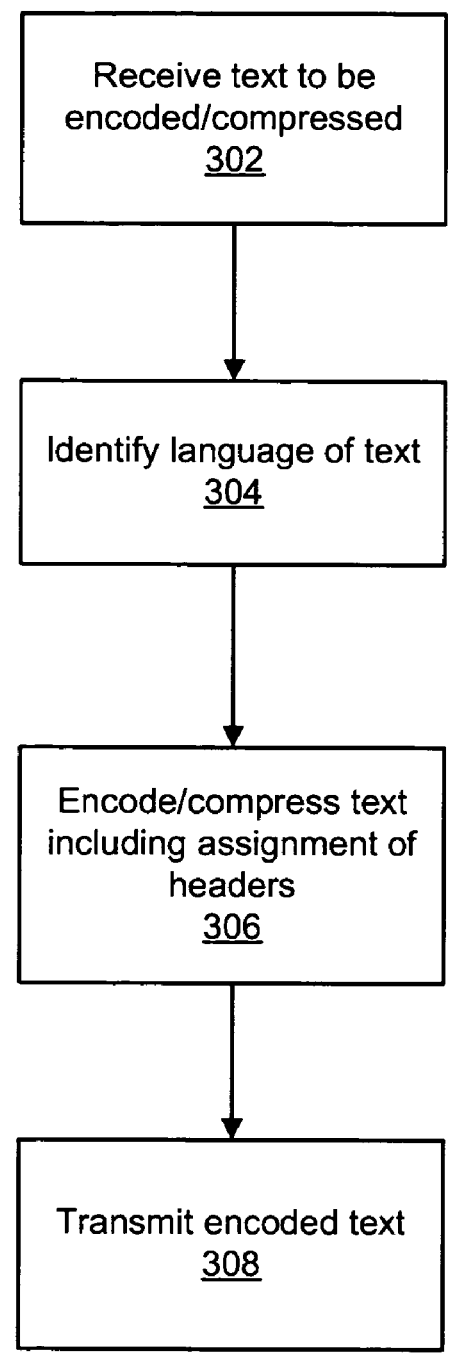
FIG. 3 illustrates a method for compressing text using variable length codes and at least one header in accordance with an embodiment.

Returning to FIG. 1, encoder 102 may compress text 106 using variable length codes of a variable length code set that may be generated as described above with respect to FIG. 2. The variable length codes may be stored in memory 104 that is coupled to encoder 102. FIG. 3 illustrates a method for compressing text using variable length codes and at least one header in accordance with an embodiment. At block 302, text is received to be compressed (or encoded) using the variable length codes. At block 304, the language of the text is identified so that the appropriate variable length codes for the particular language may be retrieved and used to compress the text. At block 306, the words of the text are compressed (or encoded) by identifying the appropriate assigned variable length code for each word and replacing the word with its corresponding code. In addition, in order to identify where a change in code length occurs in the compressed text, at least one header is provided that includes information identifying the location of a subsequent change in code length, e.g., from a two byte code to a three byte code. It may be assumed that words will be assigned the shortest code length (e.g., two bytes) and a header is used to identify the exceptions to this assumption (i.e., three byte codes, four byte codes, etc.). FIG. 4 is a table showing exemplary variable length code and header formats in accordance with an embodiment. For example, the word "the" 402 has an original length 404 of four bytes plus a trailing space (or text delimiter). A variable code length 406 of two bytes may be assigned based on the length of the text word and the frequency of occurrence of the text word resulting in a compression 410 of two times. An exemplary code format 408 may include a header, including information regarding the location of the next subsequent change in code length, and a payload (i.e., the associated code for the word "the").

Returning to FIG. 3, a first header may be located at a known starting point in the compressed text, for example, prior to the first variable length code corresponding to the first word of the text. Preferably, a header is not associated with each variable length code of the compressed text, but rather headers are placed only infrequently in the compressed text. The first header provides a distance to the first subsequent shift in code length (e.g., when a shift from a two byte code to a three byte code occurs). For example, the first header could indicate that sixteen (16) codes (i.e., the lengths of bits representing each word) forward in the compressed text a three byte code occurs. The next header would be associated with the three byte code and would indicate the length of that code, three bytes, as well as the distance to the next subsequent shift in code length in the compressed text. Preferably, it is assumed that the length of the codes corresponding to the words in the text are the shortest code length, unless a header is provided identifying the change in code length. Accordingly, a header does not need to be associated with each code in the compressed text. Once a longer code length is encountered (as identified by a header), the next code length is assumed to be the shortest code length (e.g., two bytes) unless the header of the longer code indicates otherwise. The header of the longer code identifies where the next header (i.e., the location of the next exception to the two byte code length or the shift in code length) occurs.

The distance to a change in the code length or the location of the next header in the compressed text is based on counting the number of codes (associated with words in the text) in the compressed text until the next header occurs. Preferably, text delimiters (e.g., spaces, commas, periods, etc.) are counted to provide the distance to be included in the header during the compression process and to count codes until the location of the next header is reached during the decompression process (discussed further below).

In one embodiment, a maximum distance to the next header is used, e.g., sixteen codes. In a particular compressed text, the distance to the next change in code length may be hundreds or thousands of codes. In order to keep the size of the header as small as possible (e.g., the fewest bits), a maximum distance to the next header in the compressed text is used. For example, if the first change in the code length (e.g., from two bytes to three bytes) occurs one thousand codes ahead, the first header at the beginning of the compressed text indicates the next subsequent header is sixteen codes ahead. The next header (associated with the code sixteen words ahead) indicates that the change in code length is another sixteen codes ahead. This continues with headers at every sixteen word increment or less until the change in code length one thousand words ahead is reached.

FIG. 5 is a table showing the content of an exemplary variable length code and header in accordance with an embodiment. At bit fifteen (402) of the code, the most significant bit of the header that indicates the distance to the next subsequent change in code length is provided. As mentioned, the distance to the next scheduled change in code length may be measured by text spaces. In the exemplary embodiment of FIG. 5, the distance is represented by six bits and the least significant bit of the header distance is provided at bit ten (504). Six bits allows for a distance up to sixty four (64) codes. As discussed above, the distance may be limited to a maximum distance that is less than sixty four codes, e.g., 16 codes, to reduce the bit size required to represent the distance in the header. The header may also include bits indicating the length of the associated code or payload. As shown in FIG. 5, the length of the associated payload is represented by two bits, the most significant bit at bit nine (506) and the least significant bit at bit eight (508). By using two bits, the variable length code may include four code lengths. At bit seven (510), the most significant bit of the payload (i.e., the associated variable code) is provided.

Figure 6:
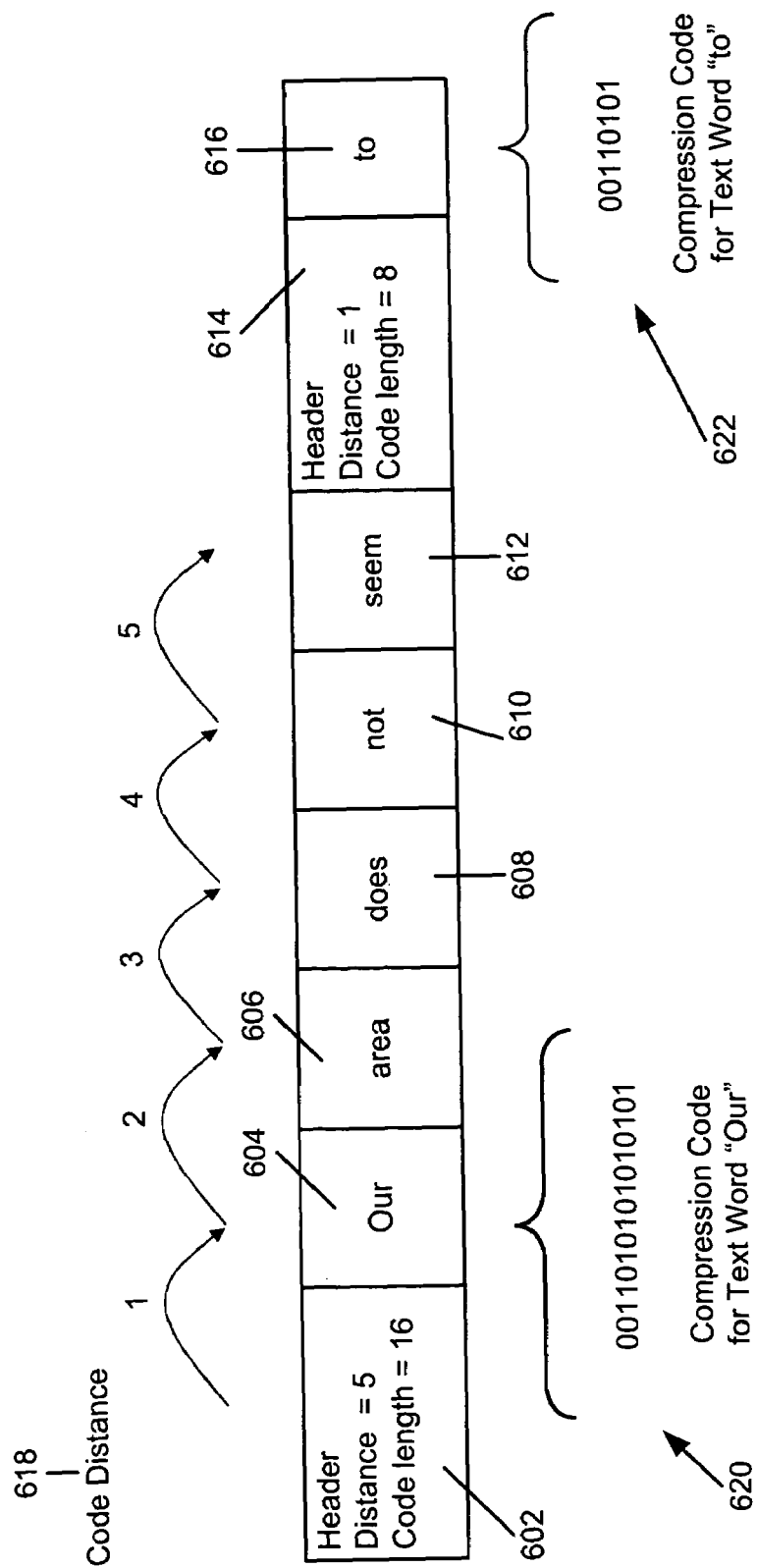
FIG. 6 illustrates an exemplary text word sequence and corresponding headers and variable length codes in accordance with an embodiment.

FIG. 6 illustrates an exemplary text word sequence and corresponding headers and variable length codes in accordance with an embodiment. The text word sequence in FIG. 6 includes the words "our" (604), "area" (606), "does" (608), "not (610), "seem" (612) and "to" (616). During the compression process, a code from the set of variable length codes (as predetermined using, for example, the method described above with respect to FIG. 2) is assigned to each word in the text. For example, as shown in FIG. 6, the word "our" (604) is assigned the sixteen bit code "0011010101010101" (620) and the word "to" is assigned to eight bit code "00110101" (622). As mentioned, the variable length codes for each word are predetermined and stored as part of a code set. A header 602 is generated and inserted into the compressed text. Header 602 indicates the code distance 618 to a subsequent change in code length, i.e., the code for the word "to" is eight bits. Alternatively, the header may include the distance to the next subsequent header. The change in code length is found five codes from header 602, i.e., at the code for the word "to." In addition, header 602 includes the length of its associated code, i.e., the code for the word "our" is sixteen bits. As shown in FIG. 6, a header 614 is also associated with the code having the different code length, i.e., the eight bit code 622 for the word "to." Header 614 indicates the length of the associated code 622 (i.e., eight bits) and the distance to the next subsequent header or change in code length in the text.

Figure 7:
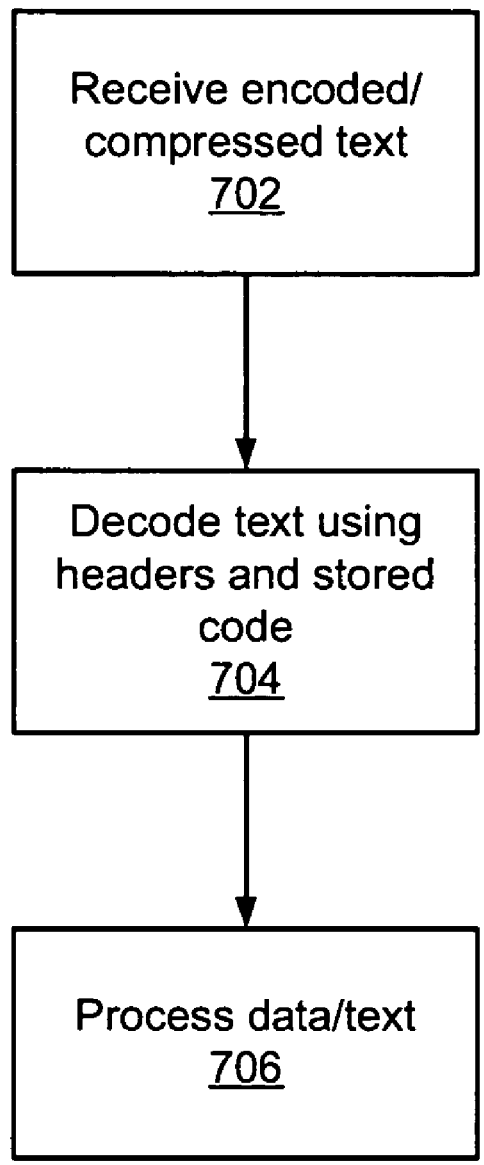
FIG. 7 illustrates a method for decoding compressed text using variable length codes and headers in accordance with an embodiment.

Returning to FIG. 3, in one embodiment, a second compression technique may be used with (or cascaded with) the first compression process. Accordingly, the text compressed using the method described above with respect to FIG. 3, may be compressed further using a known compression technique to further reduce the size of the text. At block 308, once the text is compressed and the appropriate headers inserted, the encoded text is transmitted via a communication link to a device having a decoder. FIG. 7 illustrates a method for decoding compressed text using a variable length code and headers in accordance with an embodiment. At block 702, encoded or compressed text is received. In one embodiment, the text may be a continuous or broadcast stream of text. The appropriate variable length codes (i.e., the codes corresponding to the language of the compressed text) are used to decode the compressed text at block 704. The set of variable length codes is used to identify the word associated with each code in the compressed text. During decoding, the headers included in the compressed text are used to determine changes in code length in the compressed text. Accordingly, the decoder may determine when one code ends and another code begins even though the codes in the compressed text may have different lengths. As discussed above with respect to FIG. 3, the distance to each header may be counted using text delimiters. At block 706, once the compressed text has been decoded, the text is processed accordingly. For example, the text may be displayed to the user of a computer system.

While the detailed drawings, specific examples and particular formulations given describe preferred and exemplary embodiments, they serve the purpose of illustration only. The inventions disclosed are not limited to the specific forms shown. For example, the methods may be performed in any of a variety of sequence of steps. The hardware and software configurations shown and described may differ depending on the chosen performance characteristics and physical characteristics of the computing devices. For example, the type of computing device, communications bus, or processor used may differ. The systems and methods depicted and described are not limited to the precise details and conditions disclosed. Furthermore, other substitutions, modifications, changes, and omissions may be made in the design, operating conditions, and arrangement of the exemplary embodiments without departing from the scope of the invention as expressed in the appended claims.

What is claimed is:

1. A system for compressing text using variable length codes, the system comprising:
    a memory device configured to store a set of variable length codes for a plurality of languages for compression of text, wherein the set of variable length codes includes variable code lengths based on language features; and
    an encoder coupled to the memory device, the encoder configured to receive text in at least one of the plurality of languages, to generate a compressed text by assigning a code to each word in the text based on codes from the set of variable length codes that are associated with the at least one language of the text and to generate at least one header to be inserted in the compressed text, the header including information regarding the location in the compressed text of a subsequent change in code length.

2. A system according to claim 1, wherein the language features include word lengths and frequency of occurrence of words.

3. A system according to claim 1, wherein the information included in the header includes a distance to a subsequent change in code length.

4. A system according to claim 3, wherein the distance is measured based on text delimiters in the text.

5. A system according to claim 1, wherein the information included in the header includes a distance to a subsequent header in the compressed text.

6. A system according to claim 5, wherein the distance is a maximum distance between headers.

7. A system according to claim 1, wherein the set of variable length codes is generated using Huffman encoding.

8. A system according to claim 1, wherein a header is associated with each code in the compressed text that is associated with a change in code length.

9. A system according to claim 1, wherein the encoder is further configured to identify a character string in the text that does not have a corresponding code in the set of variable length codes and to tag the character string to indicate it is not compressed.

10. A system according to claim 1, wherein the text is received as a continuous stream of text.

11. A system according to claim 1, wherein the encoder is configured to apply a second compression process to the generated compressed text.

12. A system for compressing and decompressing text using variable length codes, the system comprising:
    a first memory device configured to store a set of variable length codes for a plurality of languages for compression of text, wherein the set of variable length codes includes variable code lengths based on language features;
    an encoder coupled to the first memory device, the encoder configured to receive text in at least one of the plurality of languages, to generate a compressed text by assigning a code to each word in the text based on codes from the set of variable length codes that are associated with the at least one language of the text and to generate at least one header to be inserted in the compressed text, the header including information regarding the location in the compressed text of a subsequent change in code length;
    a second memory device configured to store the set of variable length codes for a plurality of languages for decompression of the text; and
    a decoder in data communication with the encoder and coupled to the second memory device, the decoder configured to receive the compressed text, to generate a decompressed text by identifying a word associated with each code in the compressed text based on the set of variable length codes stored in the second memory device;
    wherein the decoder identifies changes in code length based on the at least one header included in the compressed text.

13. A system according to claim 12, wherein the language features include word lengths and frequency of occurrence of words.

14. A system according to claim 12, wherein the information included in the header includes a distance to a subsequent change in code length.

15. A system according to claim 14, wherein the distance is measured based on text delimiters in the text.

16. A system according to claim 12, wherein the information included in the header includes a distance to a subsequent header in the compressed text.

17. A system according to claim 12, wherein a header is associated with each code in the compressed text that is associated with a change in code length.

18. A system according to claim 12, wherein the encoder is further configured to identify a character string in the text that does not have a corresponding code in the set of variable length codes and to tag the character string to indicate it is not compressed.

19. A system according to claim 18, wherein the decoder is further configured to provide the tagged character string as original text.

20. A system for decoding compressed text using variable length codes, the system comprising:
    a memory device configured to store a set of variable length codes for a plurality of languages for decompression of the text, wherein the set of variable length codes includes variable code lengths based on language features; and a decoder coupled to the memory device, the decoder configured to receive the compressed text having a plurality of codes and at least one header, to generate a decompressed text by identifying a word associated with each code in the compressed text based on the set of variable length codes stored in the second memory device;

wherein the at least one header includes information regarding the location in the compressed text of a subsequent change in code length;

wherein the decoder identifies changes in code length based on the at least one header included in the compressed text.

21. A system according to claim 20, wherein the language features include word lengths and frequency of occurrence of words.

22. A system according to claim 20, wherein the information included in the header includes a distance to a subsequent change in code length.

23. A system according to claim 20, wherein a header is associated with each code in the compressed text that is associated with a subsequent change in code length.

24. A method for compressing text using variable length codes, the method comprising:

receiving text to be compressed;

identifying a language of the text;

generating a compressed text by assigning a code to each word of the text using a set of variable length codes associated with the language of the text;

identifying each change in code length in the compressed text; and inserting at least one header in the compressed text, the at least one header including information regarding the location in the compressed text of a subsequent change in code length.

25. A method according to claim 24, wherein a header is associated with each code in the compressed text that is associated with a subsequent change in code length.

26. A method according to claim 24, wherein the text is received as a continuous stream of text.

* * * * *